United States Patent
Kanda

(10) Patent No.: US 11,227,916 B2
(45) Date of Patent: Jan. 18, 2022

(54) SEMICONDUCTOR DEVICE WITH A TRENCH ELECTRODE PROVIDED INSIDE A TRENCH FORMED ON AN UPPER SURFACE OF THE SEMICONDUCTOR SUBSTRATE AND METHOD OF MANUFACTURING THE SAME

(71) Applicant: Renesas Electronics Corporation, Tokyo (JP)

(72) Inventor: Ryo Kanda, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 639 days.

(21) Appl. No.: 15/934,896

(22) Filed: Mar. 23, 2018

(65) Prior Publication Data

US 2018/0358437 A1 Dec. 13, 2018

(30) Foreign Application Priority Data

Jun. 9, 2017 (JP) .............................. JP2017-114046

(51) Int. Cl.
*H01L 29/06* (2006.01)
*H01L 29/739* (2006.01)
(Continued)

(52) U.S. Cl.
CPC ...... *H01L 29/0696* (2013.01); *H01L 29/1095* (2013.01); *H01L 29/66348* (2013.01); *H01L 29/7396* (2013.01)

(58) Field of Classification Search
CPC ............. H01L 29/7396; H01L 29/0696; H01L 29/1095; H01L 29/66348
See application file for complete search history.

(56) References Cited

U.S. PATENT DOCUMENTS 5,689,128 A * 11/1997 Hshieh ................ H01L 29/0878
257/331
5,801,408 A * 9/1998 Takahashi ........... H01L 29/0696
257/212

(Continued)

FOREIGN PATENT DOCUMENTS

JP 2014-179373 A 9/2014

OTHER PUBLICATIONS

Mengliang et al., "Trench gate IGBT structure with floating P region", Journal of Semiconductors, vol. 31, No. 2, 024003-1-024003-4; (c) 2010 Chinese Institute of Electronics; Feb. 2010. (Year: 2010).*

*Primary Examiner* — Allen L Parker
*Assistant Examiner* — Charles N Ausar-El
(74) *Attorney, Agent, or Firm* — SGPatents PLLC

(57) ABSTRACT

According to an embodiment, a semiconductor device 1 includes a semiconductor substrate 50 including an upper surface, a trench electrode 22 provided inside a trench 20 formed on the upper surface, and a trench insulating film 21 provided between the trench electrode 22 and the semiconductor substrate 50. The semiconductor substrate 50 includes a first semiconductor layer of a first conductivity type, a lower end of the trench electrode 22 reaching the first semiconductor layer, a deep layer 19 of a second conductivity type partially provided on the first semiconductor layer in contact with the trench insulating film 21, a second semiconductor layer of the second conductivity type provided on the first semiconductor layer and on the deep layer 19 in contact with the trench insulating film 21, and a third semiconductor layer of the first conductivity type provided on the second semiconductor layer above the deep layer 19.

13 Claims, 16 Drawing Sheets

(51) Int. Cl.
*H01L 29/66* (2006.01)
*H01L 29/10* (2006.01)

(56) References Cited

U.S. PATENT DOCUMENTS

| | | | | |
|---|---|---|---|---|
| 5,838,026 A * | 11/1998 | Kitagawa | ............ | H01L 29/7394 |
| | | | | 257/139 |
| 5,843,796 A * | 12/1998 | Disney | ................ | H01L 29/6634 |
| | | | | 438/133 |
| 6,110,799 A * | 8/2000 | Huang | ............. | H01L 29/66348 |
| | | | | 438/430 |
| 7,345,342 B2 * | 3/2008 | Challa | ................ | H01L 29/0634 |
| | | | | 257/341 |
| 8,912,632 B2 * | 12/2014 | Ogura | ................ | H01L 29/7397 |
| | | | | 257/591 |
| 9,653,587 B2 * | 5/2017 | Matsuura | ............... | H01L 29/407 |
| 10,026,728 B1 * | 7/2018 | Agam | ................ | H01L 29/1095 |
| 10,418,441 B2 * | 9/2019 | Naito | .................... | H01L 29/36 |
| 2001/0026977 A1 * | 10/2001 | Hattori | ............... | H01L 29/7393 |
| | | | | 438/268 |
| 2007/0063269 A1 * | 3/2007 | Ng | .................... | H01L 29/66348 |
| | | | | 257/330 |
| 2009/0179260 A1 * | 7/2009 | Kobayashi | .......... | H01L 29/0869 |
| | | | | 257/330 |
| 2013/0175574 A1 * | 7/2013 | Matsuura | ............ | H01L 29/0804 |
| | | | | 257/139 |
| 2014/0203356 A1 * | 7/2014 | Kagata | .................. | H01L 29/407 |
| | | | | 257/330 |
| 2016/0190123 A1 * | 6/2016 | Laven | ................ | H01L 29/1095 |
| | | | | 257/140 |
| 2017/0092750 A1 * | 3/2017 | Nagata | ............... | H01L 29/7397 |
| 2017/0365709 A1 * | 12/2017 | Ohashi | .................. | H01L 29/086 |

\* cited by examiner

SEMICONDUCTOR DEVICE WITH A TRENCH ELECTRODE PROVIDED INSIDE A TRENCH FORMED ON AN UPPER SURFACE OF THE SEMICONDUCTOR SUBSTRATE AND METHOD OF MANUFACTURING THE SAME

CROSS-REFERENCE TO RELATED APPLICATIONS

This application is based upon and claims the benefit of priority from Japanese patent application No. 2017-114046, filed on Jun. 9, 2017, the disclosure of which is incorporated herein in its entirety by reference.

BACKGROUND

The present disclosure relates to a semiconductor device and a method of manufacturing the same. The present disclosure relates to, for example, a semiconductor device including an IGBT having a trench gate structure and a method of manufacturing the semiconductor device.

The IGBT (Insulated Gate Bipolar Transistor) has a parasitic NPN structure due to its structure. When this parasitic NPN structure operates, an overcurrent flows, which leads to a risk of destroying the IGBT. Specifically, when a high voltage state and high current state such as a short circuit (load short circuit, earthing fault, and powering fault) occurs, a base potential of the parasitic NPN structure rises due to an avalanche current. This causes the parasitic NPN structure to operate and latch-up, resulting in the destruction of the IGBT. For IGBTs such as inverter applications, the time to destruction (short-circuit tolerance) in a short-circuited state is regarded as an important spec. In designing, the conduction ability is lowered intentionally, so that the amount of a current at the time of a short circuit is reduced, and a high short-circuit tolerance is achieved. However, intentional lowering of the conduction ability leads to an increased conduction loss. As described above, in the IGBT, there is a trade-off relationship between the conduction ability (saturation voltage) and the short-circuit tolerance.

SUMMARY

An effective way to reduce the latch-up caused by the operation of the parasitic NPN structure is to, as shown in FIGS. 27 and 28, increase the impurity concentration of the P type layer, which corresponds to the base of the parasitic NPN structure, and lower the resistance value of a base resistance rb. However, an increase in the impurity concentration of the P type layer, which corresponds to the base, could cause the impurity concentration of the channel to increase. This influences a threshold voltage Vth. In view of this, there is a limit in the impurity concentration of the P type layer corresponding to the base.

Other problems of the related art and new features of the present disclosure will become apparent from the following descriptions of the specification and attached drawings.

An example aspect is a semiconductor device including: a semiconductor substrate including an upper surface; a trench electrode provided inside a trench formed on the upper surface; and a trench insulating film provided between the trench electrode and the semiconductor substrate. The semiconductor substrate includes: a first semiconductor layer of a first conductivity type, a lower end of the trench electrode reaching the first semiconductor layer; a deep layer of a second conductivity type partially provided on the first semiconductor layer in contact with the trench insulating film; a second semiconductor layer of the second conductivity type provided on the first semiconductor layer and on the deep layer in contact with the trench insulating film; and a third semiconductor layer of the first conductivity type provided on the second semiconductor layer above the deep layer.

According to the above example aspect, it is possible to provide a semiconductor device that can improve a latch-up tolerance and a short-circuit tolerance and a method of manufacturing the semiconductor device.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

For the clarification of the description, the following description and the drawings may be omitted or simplified as appropriate. Throughout the drawings, the same components are denoted by the same reference signs and repeated descriptions will be omitted as appropriate.

First Embodiment: Configuration

Figure 1:
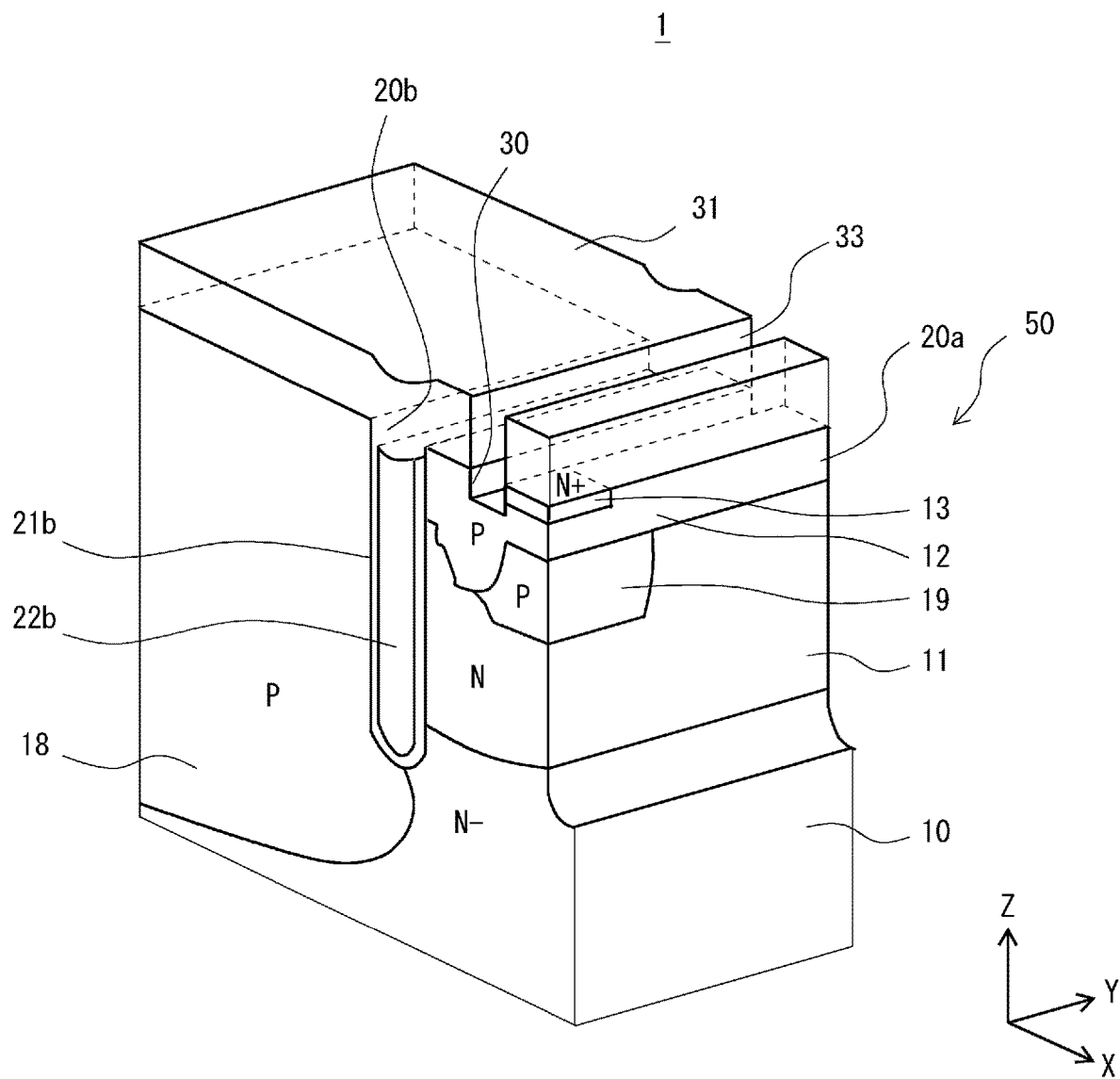
FIG. 1 is a perspective view showing an example of a semiconductor device according to a first embodiment.
Figure 2:
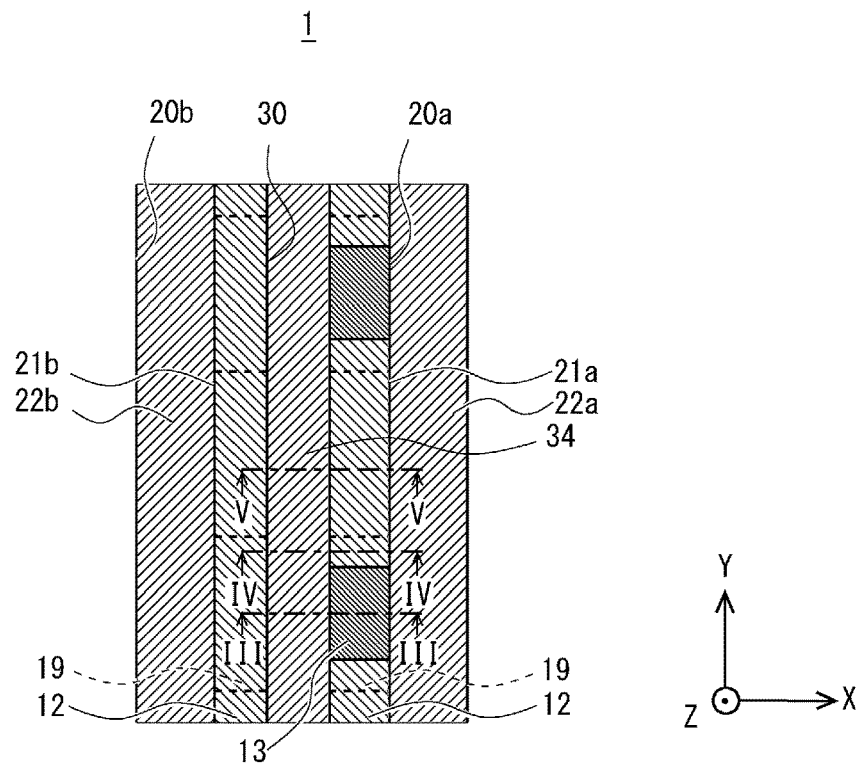
FIG. 2 is a top view showing an example of the semiconductor device according to the first embodiment.
Figure 3:
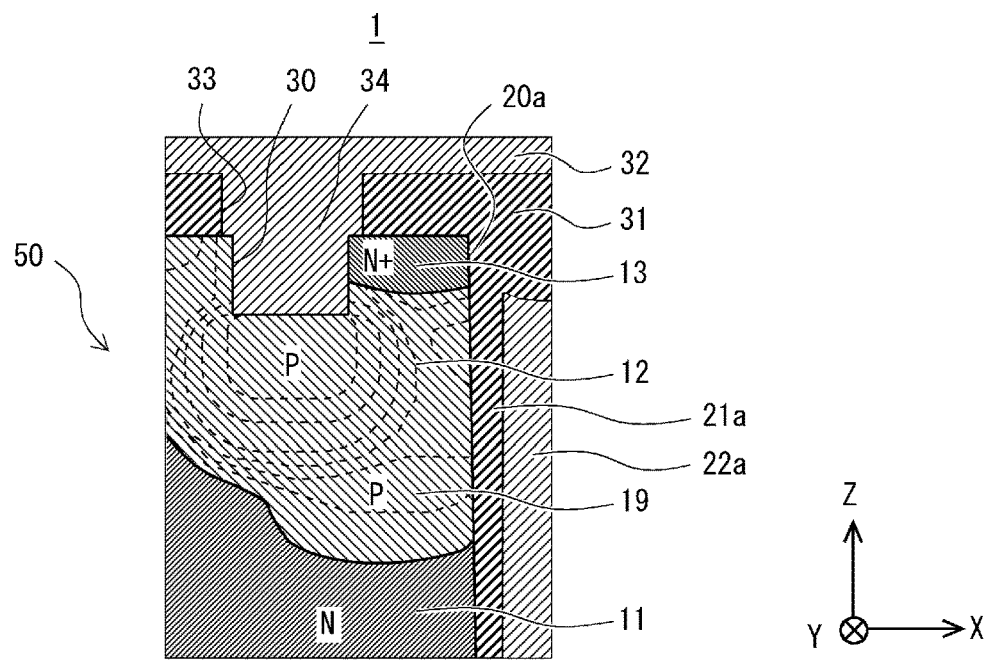
FIG. 3 is a cross-sectional view showing an example of the semiconductor device according to the first embodiment and showing a cross section taken along the line III-III of FIG. 2.
Figure 4:
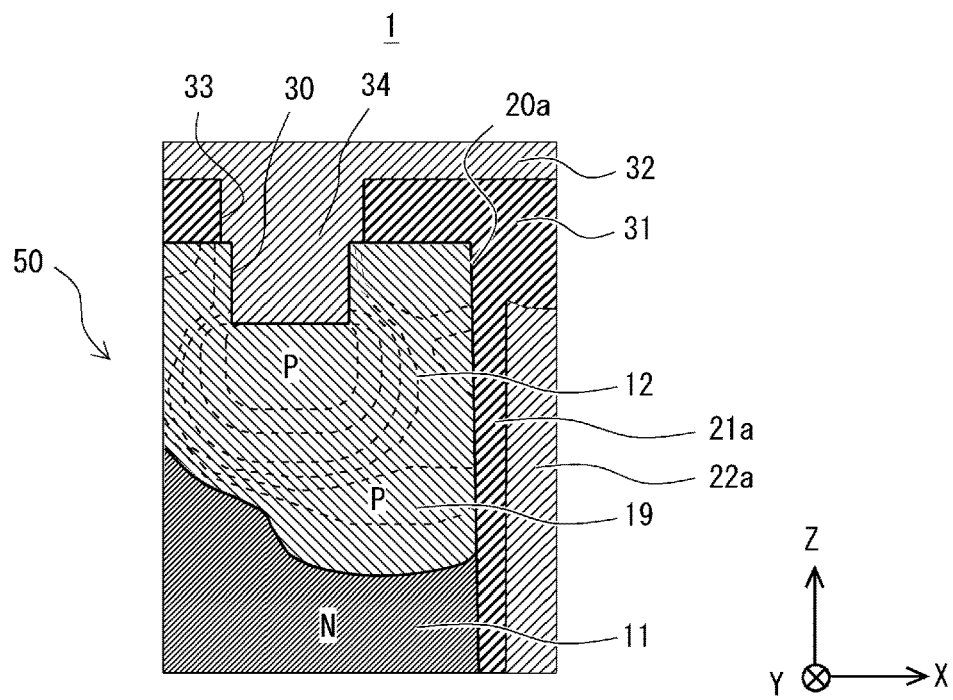
FIG. 4 is a cross-sectional view showing an example of the semiconductor device according to the first embodiment and showing a cross section taken along the line IV-IV of FIG. 2.
Figure 5:
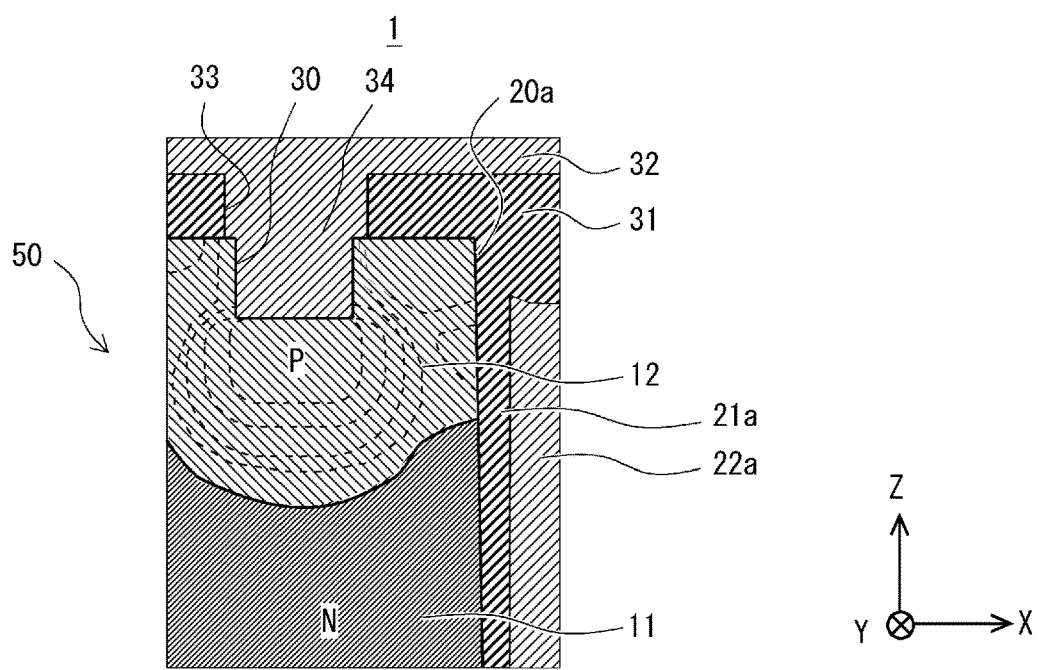
FIG. 5 is a cross-sectional view showing an example of the semiconductor device according to the first embodiment and showing a cross section taken along the line V-V of FIG. 2.

A semiconductor device and a method of manufacturing the semiconductor device according to a first embodiment will be described. First, a configuration of the semiconductor device according to the first embodiment will be described. FIG. 1 is a perspective view showing an example of the semiconductor device according to the first embodiment. FIG. 2 is a top view showing an example of the semiconductor device according to the first embodiment. FIGS. 3 to 5 are cross-sectional views showing an example of the semiconductor device according to the first embodiment. FIG. 3 shows a cross section taken along the line III-III of FIG. 2. FIG. 4 shows a cross section taken along the line IV-IV of FIG. 2. FIG. 5 shows a cross section taken along the line V-V of FIG. 2. In FIGS. 1 and 2, an emitter wiring layer provided in the upper part of the semiconductor device is not shown, and in FIG. 2, an interlayer insulating layer provided in the upper part of the semiconductor device is not shown.

As shown in FIGS. 1 to 5, the semiconductor device 1 includes a semiconductor substrate 50. The semiconductor substrate 50 includes a drift layer 10, a hole barrier layer 11, a body layer 12, an emitter layer 13, a floating layer 18, and a deep layer 19. The semiconductor substrate 50 is, for example, a silicon substrate containing silicon. Note that the semiconductor substrate 50 is not limited to a material made of silicon and may instead be made of another semiconductor material. A main surface of the semiconductor substrate 50 is referred to as an upper surface. The semiconductor substrate 50 includes the upper surface. The drift layer 10 and the hole barrier layer 11 are also referred to as a first semiconductor layer. The body layer 12 is also referred to as a second semiconductor layer. The emitter layer 13 is also referred to as a third semiconductor layer.

Trenches 20 (20a and 20b) are formed in the upper surface of the semiconductor substrate 50. The term "trench 20" is used to collectively refer to the trenches 20a and 20b instead of indicating one of them, although the plurality of the trenches 20a and 20b are formed in the drawings.

The trench 20 extends in the one direction in a plane parallel to the upper surface of the semiconductor substrate 50. The plurality of the trenches 20 extending in the one direction may be provided in the upper surface of the semiconductor substrate 50. The plurality of trenches 20 are arranged side by side in another direction orthogonal to the one direction in the plane parallel to the upper surface of the semiconductor substrate 50.

An XYZ orthogonal coordinate axis system is introduced in order to describe the semiconductor device 1. A direction orthogonal to the upper surface of the semiconductor substrate 50 is defined as a Z axis direction. For the sake of convenience, a +Z axis direction is referred to as upward, and a −Z axis direction is referred to as downward. The directions of the XYZ orthogonal coordinate axes and upward and downward directions are used for convenience of describing the semiconductor device 1. Thus, the upper surface of the semiconductor substrate 50 does not necessarily have to face the +Z axis and upward directions when the semiconductor device 1 is used. The one direction in the plane parallel to the upper surface of the semiconductor substrate 50 is defined as a Y axis direction. Thus, the one direction in which the trench 20 extends is the Y axis direction. Another direction orthogonal to the one direction in the plane parallel to the upper surface of the semiconductor substrate 50 is defined as an X axis direction. The plurality of trenches 20 are formed side by side in the X axis direction.

Among the plurality of trenches 20, one of the adjacent trenches 20 is referred to as the trench 20a, and the other is referred to as the trench 20b. For example, the trench 20 on the side of the +X axis direction is referred to as the trench 20*a*, and the trench 20 formed on the side of the −X axis direction of the trench 20*a* is referred to as the trench 20*b*.

Trench insulating films 21 (21*a* and 21*b*) are formed on inner surfaces of the trenches 20, respectively. The term "trench insulating film 21" is used to collectively refer to the trench insulating films 21*a* and 21*b* instead of indicating one of them, although the plurality of the trench insulating films 21*a* and 21*b* are formed in the drawings.

The trench insulating film 21 contains, for example, a silicon oxide film as a material. Note that the trench insulating film 21 may include an insulating film other than a silicon oxide film. The trench insulating film 21 formed on the inner surface of the trench 20*a* is referred to as the trench insulating film 21*a*. The trench insulating film 21 formed on the inner surface of the trench 20*b* is referred to as the trench insulating film 21*b*.

The trench electrode 22 (22*a* and 22*b*) is provided inside the trench 20 formed in the upper surface of the semiconductor substrate 50. The term "trench electrode 22" is used to collectively refer to the trench electrodes 22*a* and 22*b* instead of indicating one of them, although the plurality of the trench electrodes 22*a* and 22*b* are formed in the drawings.

The trench electrode 22 is formed inside the trench 20 with the trench insulating film 21 interposed therebetween. The trench insulating film 21 is provided between the trench electrode 21 and the semiconductor substrate 50. The trench electrode 22 contains, for example, polysilicon as a conductive material. Thus, the trench electrode 22 has a conductive material buried in the trench 20.

Like the trench 20, the trench electrode 22 extends in one direction, i.e., in the Y axis direction. A conductive material may be buried in the plurality of trenches 20 to thereby provide a plurality of trench electrodes 22. When a plurality of the trench electrodes 22 are provided, the trench electrodes 22 are arranged side by side in the other direction, i.e., in the X axis direction. The trench electrode 22 formed inside the trench 20*a* is referred to as the trench electrode 22*a*. Further, the trench electrode 22 formed inside the trench 20*b* is referred to as the trench electrode 22*b*.

A contact groove 30 is formed in the upper surface of the semiconductor substrate 50. The contact groove 30 is formed to extend in the one direction parallel to the upper surface of the semiconductor substrate 50, i.e., in the Y axis direction. The contact groove 30 is arranged side by side with the trench 20. When the plurality of trenches 20 are formed, the contact groove 30 is arranged, for example, between the adjacent trenches 20. For example, the contact groove 30 is provided between the trench 20*a* and the trench 20*b*. The length of the contact groove 30 in the Z axis direction is less than that of the trench 20. That is, the depth of the contact groove 30 is less than that of the trench 20.

In the cross section of the line III-III of FIG. 2, the drift layer 10, the hole barrier layer 11, the deep layer 19, the body layer 12, and the emitter layer 13 are stacked in order from the bottom on the semiconductor substrate 50 in contact with the trench insulating film 21*a*. In the cross section of the line IV-IV in FIG. 2, the drift layer 10, the hole barrier layer 11, the deep layer 19 and the body layer 12 are stacked in order from the bottom on the semiconductor substrate 50 in contact with the trench insulating film 21*a*. In the cross section of the line V-V of FIG. 2, the drift layer 10, the hole barrier layer 11, and the body layer 12 are stacked in order from the bottom on the semiconductor substrate 50 in contact with the gate insulating film 21*a*.

The drift layer 10 is, for example, an N− type semiconductor layer doped with an N− type impurity at a low concentration. The drift layer 10 is in contact with the trench insulating film 21. For example, the drift layer 10 is in contact with the trench insulating film 21*a* and the trench insulating film 21*b*. A lower end of the trench 20 and a lower end of the trench electrode 22 reach the drift layer 10. For example, a lower end of the trench 20*a* and a lower end of the trench electrode 22*a* are positioned at the drift layer 10. Note that a lower end of the trench 20*b* and the lower end of the trench electrode 22*b* may be positioned at the drift layer 10.

For convenience, N type, N− type, and N+ type are referred to as a first conductivity type, and P type, P− type, and P+ type are referred to as a second conductivity type. Note that the N-type, N− type, and N+ type may be referred to as the second conductivity type, and the P type, P− type, and P+ type may be referred to as the first conductivity type. Doping the N type impurity at a low concentration is referred to the N− type, doping the N type impurity at a high concentration is referred to the N+ type, and doping the N type impurity at a concentration higher than the low concentration and lower than the high concentration is referred to as the N type. Likewise, doping the P type impurity at a low concentration is referred to the P− type, doping the P type impurity at a high concentration is referred to the P+ type, and doping the P type impurity at a concentration higher than the low concentration and lower than the high concentration is referred to as the P type.

The drift layer 10 is referred to as a first semiconductor layer. Note that the hole barrier layer 11 may be provided on the drift layer 10. In such case, the first semiconductor layer includes the drift layer 10 and the hole barrier layer 11. The hole barrier layer 11 is in contact with the trench insulating film 21 provided on a side surface of the trench 20. For example, the hole barrier layer 11 is in contact with the trench insulating film 21*a* and the trench insulating film 21*b*. Thus, the first semiconductor layer is in contact with the trench insulating film 21*a* and the trench insulating film 21*b*. The hole barrier layer 11 is, for example, an N type semiconductor layer doped with the N type impurity.

The deep layer 19 is provided on the first semiconductor layer. The deep layer 19 is provided on the drift layer 10 or on the drift layer 10 and on the hole barrier layer 11. The deep layer 19 is partially provided on the first semiconductor layer. For example, the deep layer 19 is partially provided on the first semiconductor layer in the Y axis direction. Thus, the first semiconductor layer has a portion where the deep layer 19 is provided and a portion where the deep layer 19 is not provided. A lower surface of the deep layer 19 and side surfaces of the deep layer 19 in the Y axis direction are covered with the first semiconductor layer.

A plurality of the deep layers 19 may be provided on the drift layer 10. When a plurality of deep layers 19 are provided on the drift layer 10, the deep layers 19 are spaced apart from one another, for example, in the Y axis direction. Each deep layer 19 is in contact with the trench insulating film 21 provided on the side surface of the trench 20. For example, the deep layer 19 is in contact with the trench insulating film 21*a*.

The deep layer 19 is provided from the trench 20 to under the contact groove 30 that is adjacent to the trench 20. Note that the deep layer 19 may be provided from one trench 20 to the other trench 20 between the adjacent trenches 20. The deep layer 19 is, for example, a P type semiconductor layer doped with the P type impurity.

The body layer 12 is provided on the first semiconductor layer and on the deep layer 19. The body layer 12 is in contact with the trench insulating film 21 provided on the side surface of the trench 20. For example, the body layer 12 is in contact with the trench insulating film 21*a* and the trench insulating film 21*b*. The body layer 12 is, for example, a P type semiconductor layer doped with the P type impurity.

For example, the concentration of the P type impurity doped in the body layer 12 is made lower than the concentration of the P type impurity doped in the deep layer 19. That is, the impurity concentration of the deep layer 19 is higher than the impurity concentration of the body layer 12. A lower end of the contact groove 30 is positioned at the body layer 12. The lower surface of the body layer 12 is in contact with the first semiconductor layer and the deep layer 19. The side surfaces of the deep layer 19 in the Y axis direction may be covered with the body layer 12.

The emitter layer 13 is provided on the body layer 12 above the deep layer 19. The emitter layer 13 is partially provided in the Y axis direction. Thus, the body layer 12 has a portion where the emitter layer 13 is provided and a portion where the emitter layer 13 is not provided. The trench insulating film 21 may be provided between the trench electrode 22 and the emitter layer 13, the body layer 12, the deep layer 19, and the first semiconductor layer.

The length of the emitter layer 13 in the Y axis direction is less than the length of the deep layer 19 in the Y axis direction. Accordingly, the emitter layer 13 is not partially provided above the deep layer 19. Further, the deep layer 19 and the emitter layer 13 are not partially provided above the drift layer 10.

A plurality of the emitter layers 13 may be provided on the body layer 12. When a plurality of emitter layers 13 are provided on the body layer 12, the emitter layers 13 are spaced apart from one another in the Y axis direction. Thus, the plurality of the deep layers 19 and the plurality of the emitter layer 13 are spaced apart from one another along the one direction, and the emitter layer 13 is not provided in the upper part of the first semiconductor layer between the adjacent deep layers 19.

Each emitter layer 13 is in contact with the trench insulating film 21 provided on the side surface of the trench 20. For example, the emitter layer 13 is in contact with the trench insulating film 21*a* provided on the side surface of the trench 20*a*. The emitter layer 13 is provided between the trench 20 and the contact groove 30 that is adjacent to the trench 20. The emitter layer 13 is, for example, an N+ type semiconductor layer doped with the N type impurity at a high concentration.

Figure 6:
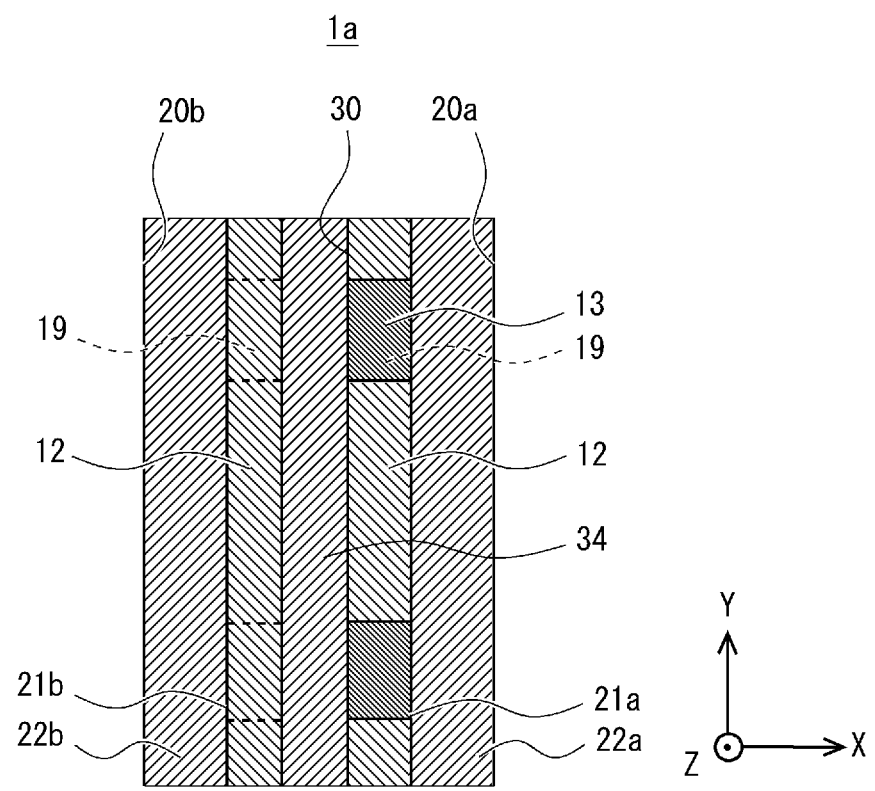
FIG. 6 is a top view showing an example of a semiconductor device according to a modified example of the first embodiment.

Like the semiconductor device 1a according to a modified example of the embodiment shown in FIG. 6, the length of the emitter layer 13 in the Y axis direction may be substantially equal to the length of the deep layer 19 in the Y axis direction. Being substantially equal here includes not only, in a strict sense, being identical but also being equal within a certain range in view of a technical purpose. For example, when the deep layer 19 and the emitter layer 13 are formed by ion implantation using the same mask, the length of the formed deep layer 19 in the Y axis direction and the length of the emitter layer 13 in the Y may be different, in a strict sense, by an amount of an error caused by the implantation technique. However, the length of the deep layer 19 and the length of the emitter layer 13 in the Y direction including such an error are substantially the same.

As shown in FIGS. 1 and 2, when the plurality of trench electrodes 22 are provided, a portion between the adjacent trench electrodes 22 in the semiconductor substrate 50 includes the drift layer 10, the hole barrier layer 11, the deep layer 19, the body layer 12 and the emitter layer 13. A floating layer 18 may be provided in a portion other than the portion of the semiconductor substrate 50 between the trench electrodes 22.

Specifically, when the plurality of the trench electrodes 22 include one trench electrode 22*a* and another trench electrode 22*b*, the drift layer 10, the hole barrier layer 11, the deep layer 19, the body layer 12 and the emitter layer 13, which are provided between the one trench electrode 22*a* and the other trench electrode 22*b*, are in contact with the trench insulating film 21*a* provided around the one trench electrode 22*a*. The floating layer 18 is provided on the side of the −X axis direction of the other trench electrode 22*b* and is in contact with the trench insulating film 21*b* provided around the other trench electrode 22*b*.

The floating layer 18 is provided on the drift layer 10. The lower end of the trench electrode 22*b* may be positioned at the floating layer 18. An interface between the floating layer 18 and the drift layer 10 may be connected to the lower end of the trench electrode 22*b*. The floating layer 18 is a P type semiconductor layer doped with the P type impurity.

In this way, the semiconductor device 1 includes, in addition to the semiconductor substrate 50, the trench electrode 22 provided inside the trench 20, and the trench insulating film 21 provided between the trench electrode 22 and the semiconductor substrate 50.

The semiconductor device 1 may further include an interlayer insulating layer 31, an emitter wiring layer 32, a field stop layer, a collector layer, and a collector wiring layer.

The interlayer insulating layer 31 is provided in the upper part of the semiconductor substrate 50. Specifically, the interlayer insulating layer 31 is provided on the body layer 12 and on the emitter layer 13 in the semiconductor substrate 50. A through groove 33 is provided in the interlayer insulating layer 31. The through groove 33 is formed to penetrate the interlayer insulating layer 31. The through groove 33 communicates with the contact groove 30. The interlayer insulating layer 31 includes, for example, a silicon oxide film as an insulating material. Note that the interlayer insulating layer 31 may contain an insulating material other than the silicon oxide film.

The emitter wiring layer 32 is provided on the interlayer insulating layer 31. The emitter wiring layer 32 is connected to the body layer 12 via a contact 34. The emitter wiring layer 32 is also referred to as a wiring layer. The contact 34 is provided inside the through groove 33 penetrating the interlayer insulating layer 31 and inside the contact groove 30 formed in the body layer 12. Thus, a lower end of the contact 34 is positioned lower than an upper end of the body layer 12. Further, a contact layer may be provided between the contact 34 and the body layer 12. The contact layer is, for example, a P+ type semiconductor layer doped with the P type impurity at a high concentration.

The emitter wiring layer 32 and the contact 34 contain, for example, aluminum (Al) as a conductive material. Note that the emitter wiring layer 32 and the contact 34 may contain a conductive material other than aluminum. A barrier metal may be provided between the emitter wiring layer 32 and the contact 34 and between the interlayer insulating layer 31 and the body layer 12.

A field stop layer (not shown) may be provided under the drift layer 10. The field stop layer is, for example, an N type semiconductor layer doped with the N type impurity. A collector layer (not shown) may be provided under the field stop layer. The collector layer is, for example, a P type semiconductor layer doped with the P type impurity. A collector wiring layer may be provided under the collector layer. The collector wiring layer contains, for example, aluminum (Al) as a conductive material. Note that the collector wiring layer may contain a conductive material other than aluminum.

First Embodiment: Operation

Figure 7:
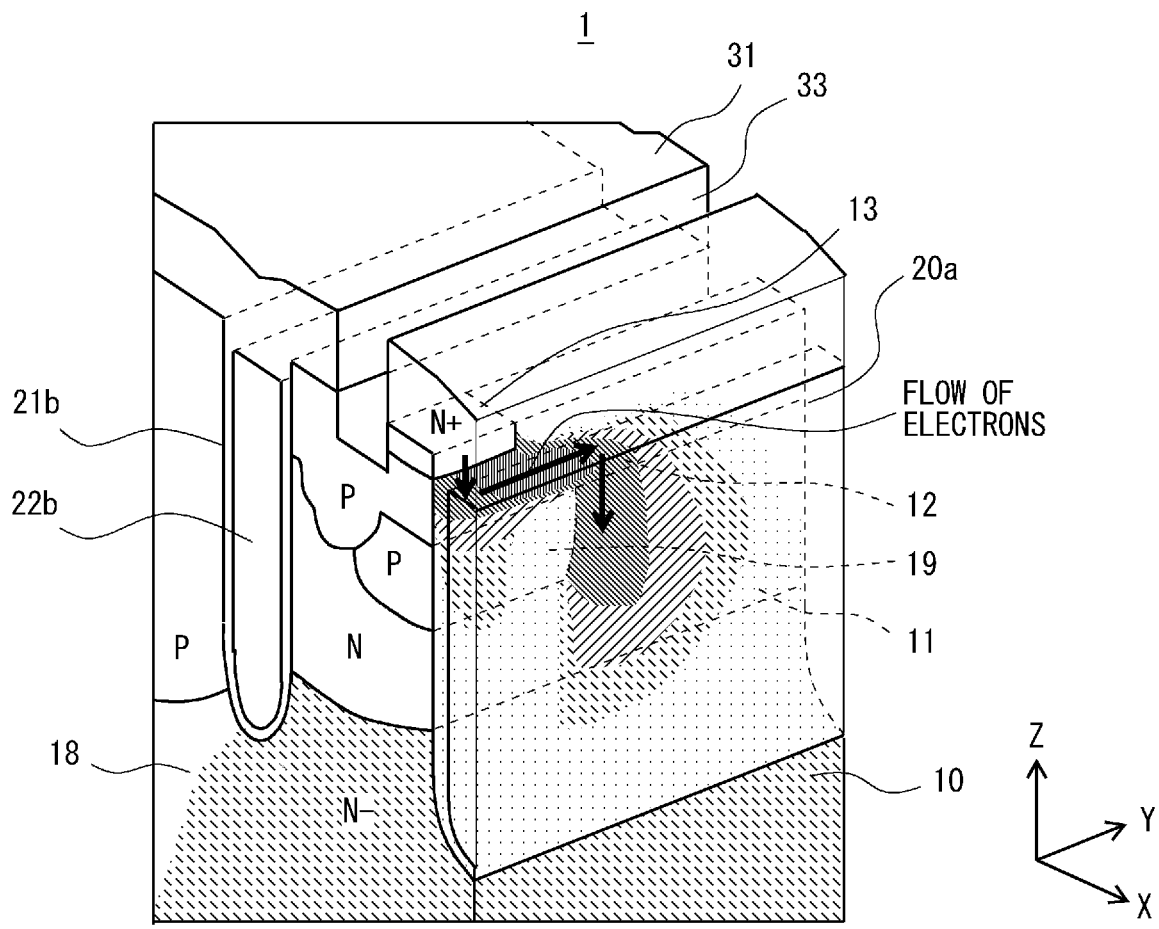
FIG. 7 is a diagram showing an example of an operation of the semiconductor device according to the first embodiment.
Figure 8:
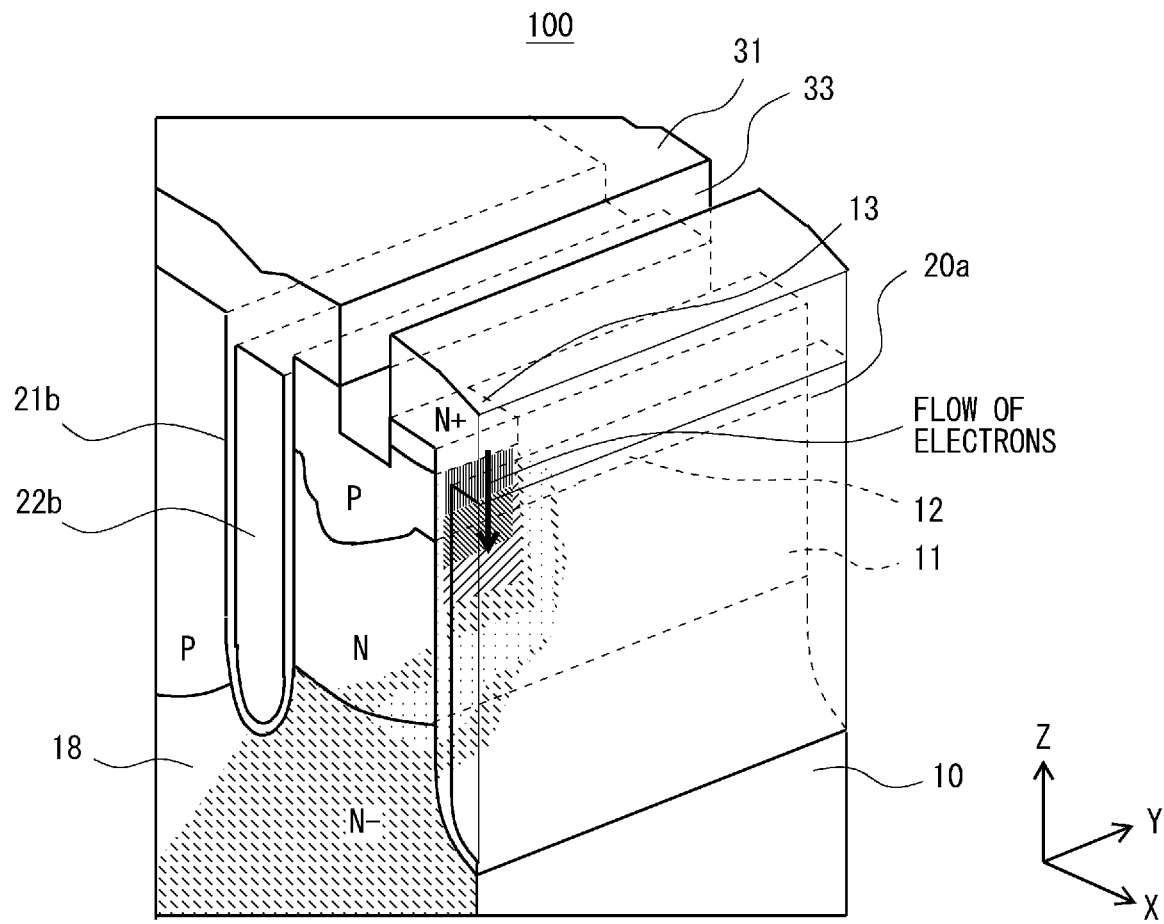
FIG. 8 is a diagram showing an example of an operation of a semiconductor device according to a comparative example.

Next, an operation of the semiconductor device 1 according to this embodiment will be described. FIG. 7 is a diagram showing an example of the operation of the semiconductor device 1 according to the first embodiment. FIG. 8 is a diagram showing an example of an operation of a semiconductor device 100 according to a comparative example.

As shown in FIG. 7, when a positive voltage is applied to the trench electrode 22, an inversion layer serving as the channel is formed in the body layer 12 near the trench insulating film 21. In this way, the trench electrode 22 has the function of a gate electrode, and the trench insulating film 21 has the function of a gate insulating film.

In the semiconductor device 1 of this embodiment, the body layer 12 is formed under the emitter layer 13 to be in contact with the trench insulating film 21. Thus, the inversion layer is formed in the body layer 12 under the emitter layer 13 near the trench insulating film 21. As a result, when the semiconductor device 1 is brought into a conduction state (ON state), electrons emitted from the emitter layer 13 move in the −Z axis direction from the emitter layer 13 toward the body layer 12 right under the emitter layer 13.

The deep layer 19 is formed between the body layer 12 and the hole barrier layer 11 under the emitter layer 13. Thus, in the body layer 12, the inversion layer extends in the +Y axis direction around the deep layer 19. Then, the electrons moving in the −Z axis direction from the emitter layer 13 change their directions to the +Y axis direction along the inversion layer extending in the +Y axis direction right above the deep layer 19.

In this embodiment, the length of the deep layer 19 in the Y axis direction is greater than the length of the emitter layer 13 in the Y axis direction. Thus, the inversion layer in the body layer 12 extends to right above an end of the deep layer 19 in the +Y axis direction. As a result, the electrons, which have changed their directions to the +Y axis direction, will move right above the end of the deep layer 19 in the +Y axis direction There is a portion where the deep layer 19 is not provided above the hole barrier layer 11. Thus, the inversion layer extends downward around the deep layer 19 on the side farther in +Y axis direction than the deep layer 19 in the +Y axis direction. As a result, the electrons, which have moved to right above the end of the deep layer 19 in the +Y axis direction, change their directions to the −Z direction at the side farther in the +Y axis direction than the end of the deep layer 19 in the +Y axis direction. Then, the electrons reach the drift layer 10 via the hole barrier layer 11.

The profile of the impurity concentration of the deep layer 19 does not influence the impurity concentration of the body layer 12. That is, the profile is such that an impurity in the deep layer 19 do not diffuse into the portion where the channel is formed in the body layer 12. Thus, the body layer 12 serving as the channel is three-dimensionally formed in the path from the emitter layer 13 to the hole barrier layer 11. This reduces the influence on the impurity concentration of the body layer 12, and thus an influence on a threshold voltage Vth of the channel can be reduced.

As described above, in the semiconductor device 1 of this embodiment, a base resistance rb of the parasitic NPN structure can be reduced by covering a lower portion of the emitter layer 13 with the deep layer 19 containing the high concentration P type impurity. In addition, a path is established for a channel current (electrons) to flow along the inversion layer formed three dimensionally at the threshold voltage Vth, which is the same as that of the related art. With such a structure, the semiconductor device 1 can improve the latch-up tolerance, thereby improving the short-circuit tolerance. This means that the breakdown strength in a short-circuited state such as a load short circuit is improved.

On the other hand, as shown in FIG. 8, in the semiconductor device 100 according to the comparative example, the deep layer 19 is not provided. In the semiconductor substrate 50 in contact with the trench insulating film 21, the drift layer 10, the hole barrier layer 11, the body layer 12, and the emitter layer 13 are stacked in order from the bottom. Thus, the inversion layer extends in the −Z axis direction in the body layer 12 under the emitter layer 13.

As a result, the electrons in the conduction state (ON state) move in the −Z axis direction along the inversion layer extending in the −Z axis direction from the emitter layer 13. The electrons moving in the −Z axis direction from the emitter layer 13 and reaching the inversion layer move downward and reach the drift layer 10 via the hole barrier layer 11.

As described above, in the semiconductor device 100 of the comparative example, the lower portion of the emitter layer 13 is not covered with the deep layer 19 containing the high concentration P type impurity. Thus, the base resistance rb of the parasitic NPN structure cannot be reduced. Accordingly, the latch-up tolerance cannot be improved, and thus the short-circuit tolerance cannot be improved. When the resistance of the body layer 12 is reduced in order to improve the short-circuit tolerance, the threshold voltage Vth of the channel will change.

As shown in FIGS. 1 to 5, the greater the length of the portion of the deep layer 19 in the Y axis direction where the emitter layer 13 is not formed thereon, in principle, the better the latch-up tolerance becomes. The latch-up tolerance will not change when the length of the portion of the deep layer 19 in the Y axis direction where the emitter layer 13 is not formed thereon is a certain length or greater. When the portion of the deep layer 19 in the Y axis direction where the emitter layer 13 is not formed thereon is made greater than necessary, the channel length is increased, which causes a disadvantage that the current capability deteriorates.

As shown in FIG. 6, the deep layer 19 is formed by a method such as ion implantation using the same mask as that for the emitter layer 13, and the length of the emitter layer 13 in the Y axis direction and the length of the deep layer 19 in the Y axis direction are substantially equal. This achieves a high latch-up tolerance and reduces the manufacturing cost.

First Embodiment: Manufacturing Method

Figure 9:
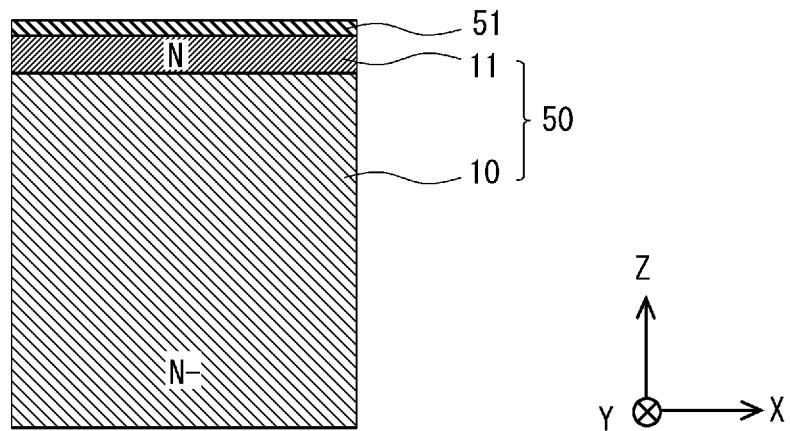
FIG. 9 is a process cross-sectional view showing an example of a method of manufacturing the semiconductor device according to the first embodiment and showing a process of forming a hole barrier layer.
Figure 10:
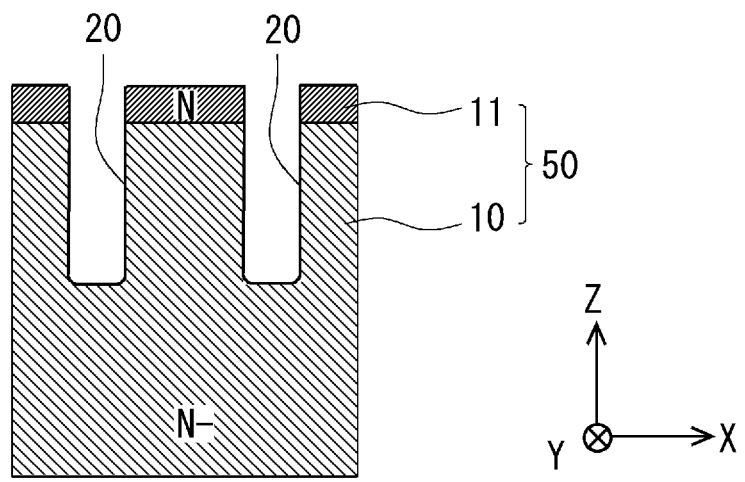
FIG. 10 is a process cross-sectional view showing an example of the method of manufacturing the semiconductor device according to the first embodiment and showing a process of forming trenches.
Figure 11:
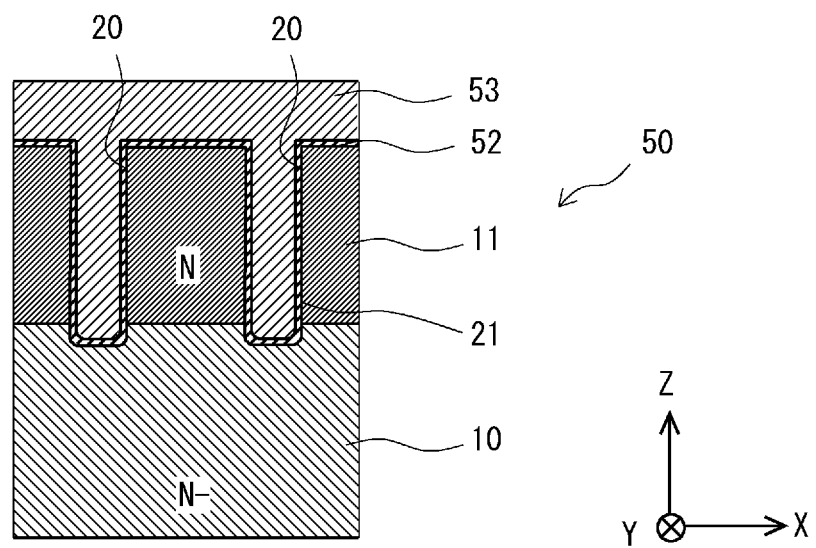
FIG. 11 is a process cross-sectional view showing an example of the method of manufacturing the semiconductor device according to the first embodiment and showing a process of forming a trench insulating film and a process of depositing polysilicon for forming trench electrodes.
Figure 12:
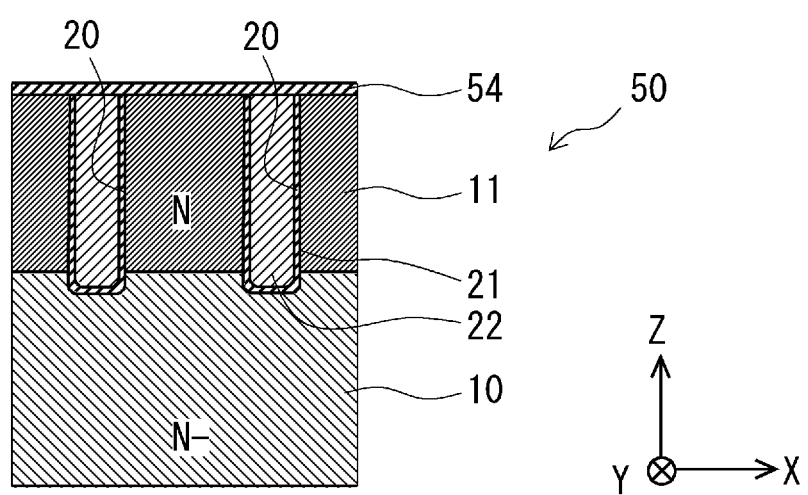
FIG. 12 is a process cross-sectional view showing an example of the method of manufacturing the semiconductor device according to the first embodiment and showing an etching back process of the polysilicon for forming the trench electrodes.
Figure 13:
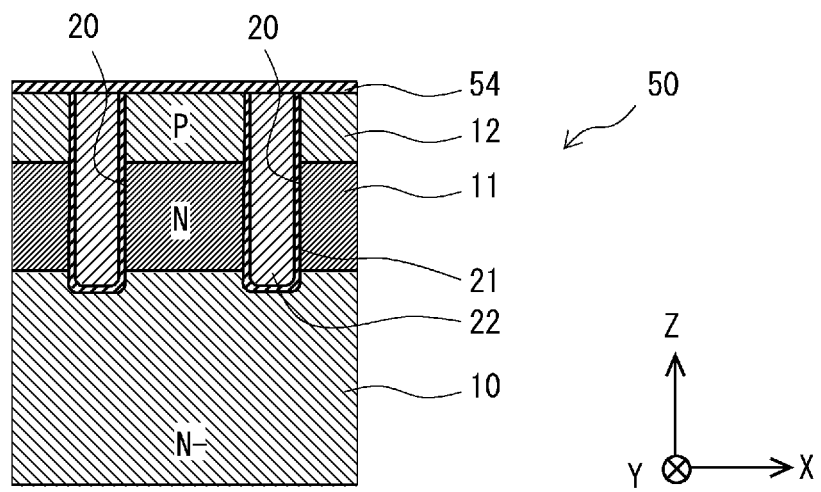
FIG. 13 is a process cross-sectional view showing an example of the method of manufacturing the semiconductor device according to the first embodiment and showing a process of forming a body layer.
Figure 14:
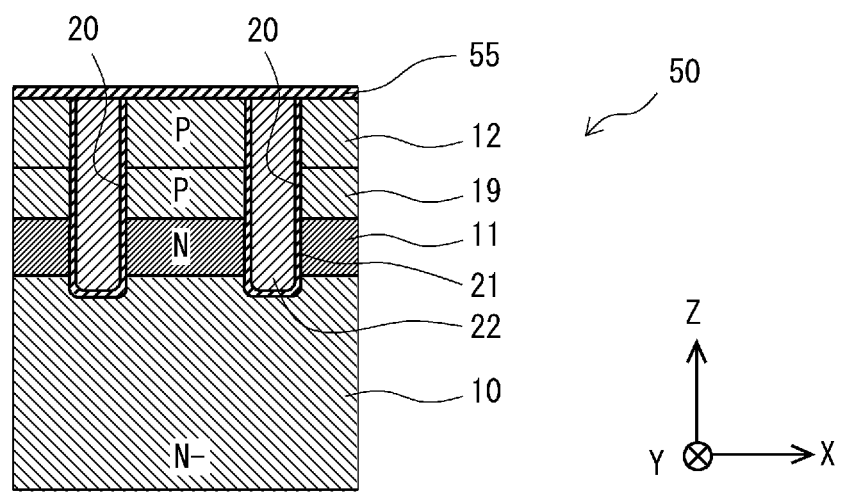
FIG. 14 is a process cross-sectional view showing an example of the method of manufacturing the semiconductor device according to the first embodiment and showing a process of forming a deep layer.
Figure 15:
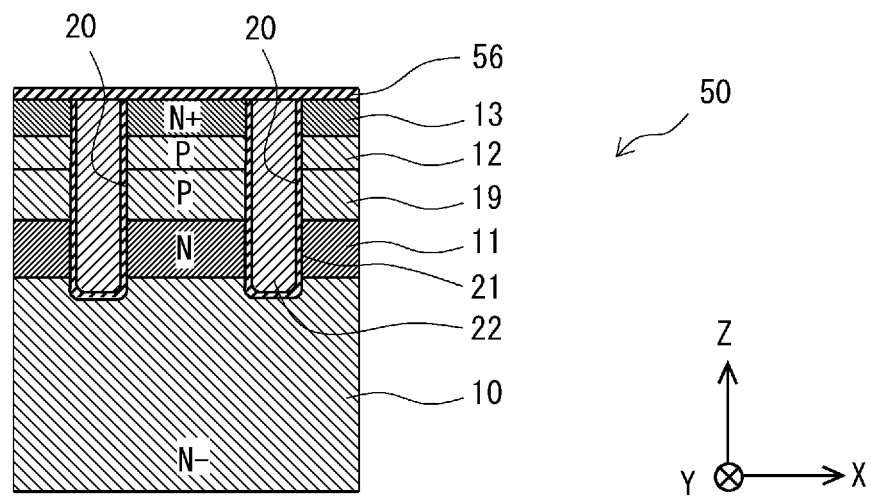
FIG. 15 is a process cross-sectional view showing an example of the method of manufacturing the semiconductor device according to the first embodiment and showing a process of forming an emitter layer.
Figure 16:
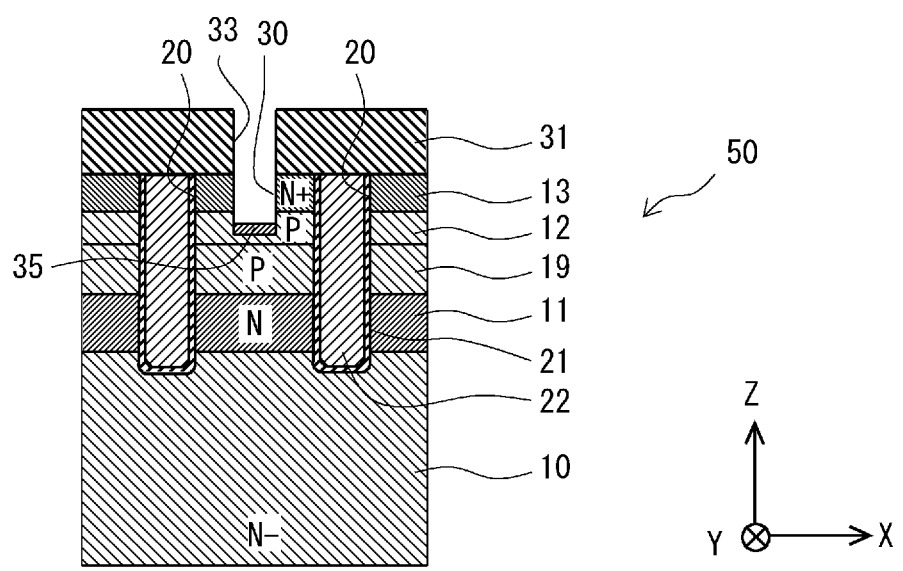
FIG. 16 is a process cross-sectional view showing an example of the method of manufacturing the semiconductor device according to the first embodiment and showing a process of forming an interlayer insulating layer, a through groove, and a contact groove.
Figure 17:
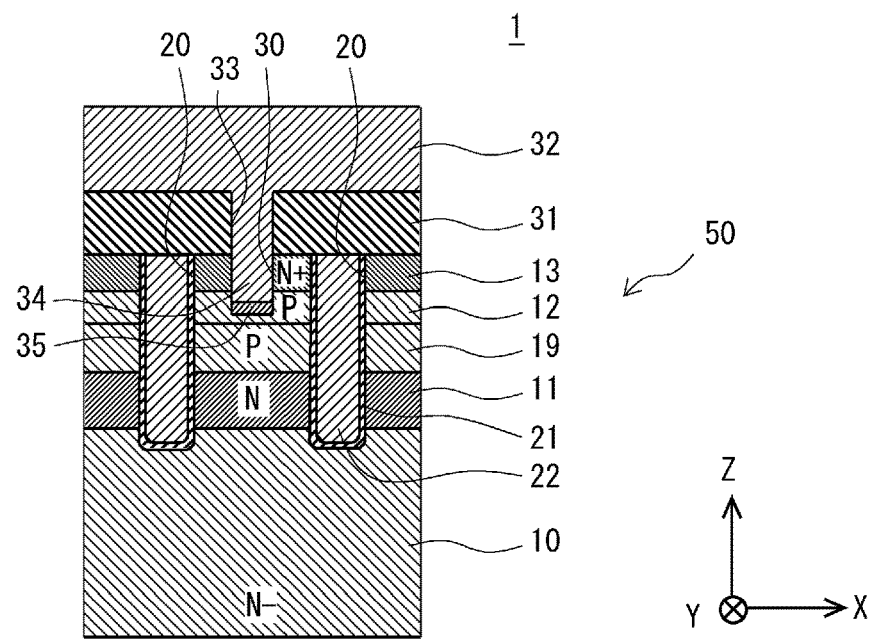
FIG. 17 is a process cross-sectional view showing an example of the method of manufacturing the semiconductor device according to the first embodiment and showing a process of forming an emitter wiring layer.
Figure 18:
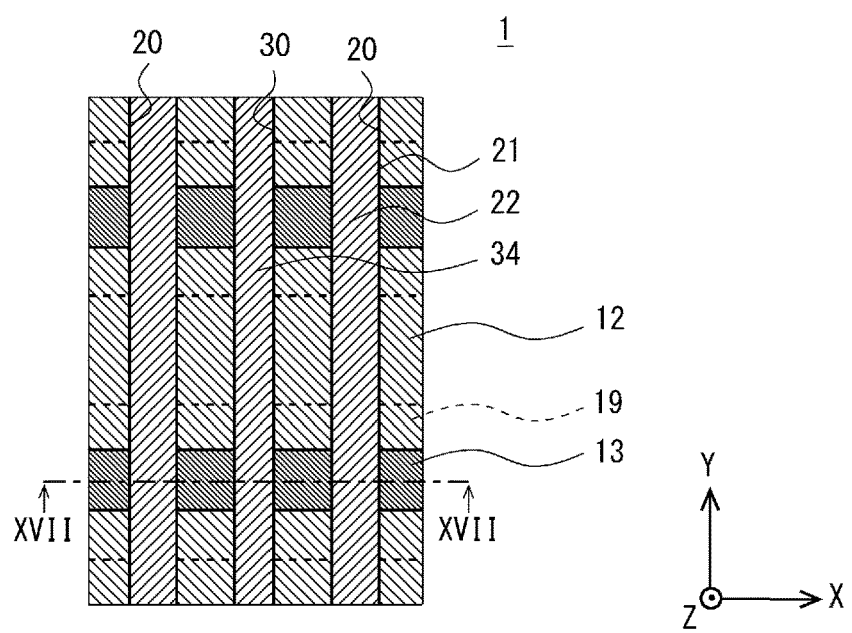
FIG. 18 is a top view showing an example of a method of manufacturing the semiconductor device according to the first embodiment.

Next, a method of manufacturing the semiconductor device 1 according to this embodiment will be described. FIGS. 9 to 17 are process cross-sectional views showing an example of the method of manufacturing the semiconductor device 1 according to the first embodiment. FIG. 9 shows a process of forming the hole barrier layer 11. FIG. 10 shows a process of forming the trenches 20. FIG. 11 shows a process of forming the trench insulating films 21 and a process of depositing polysilicon for forming the trench electrodes 22. FIG. 12 shows a process of etching back polysilicon for forming the trench electrodes 22. FIG. 13 shows a process of forming the body layer 12. FIG. 14 shows a process of forming the deep layer 19. FIG. 15 shows a process of forming the emitter layer 13. FIG. 16 shows a process of forming the interlayer insulating layer 31, the through groove 33, and the contact groove 30. FIG. 17 shows a process of forming the emitter wiring layer 32. FIG. 18 is a top view showing an example of the semiconductor device 1 according to the first embodiment. In FIG. 18, the interlayer insulating layer 31 and the emitter wiring layer 32 are not shown.

As shown in FIG. 9, first, for example, an N− type silicon single crystal wafer is prepared as the semiconductor substrate 50. In the semiconductor substrate 50, for example, phosphorus is doped at a low concentration as an impurity. Note that the semiconductor substrate 50 is not limited to a material made of silicon but may instead be made of another semiconductor material. A resist film 51 is formed on the upper surface of the semiconductor substrate 50 by coating or the like. Next, the resist film 51 is patterned by lithography. In the patterning, a pattern is formed in the resist film 51 with an opened portion where the hole barrier layer 11 is formed.

Then, the N type impurity such as phosphorous is introduced into the upper surface of the semiconductor substrate 50 by ion implantation or the like using the patterned resist film 51 as a mask. In this manner, the hole barrier layer 11 is formed on the side of the upper surface of the semiconductor substrate 50. A lower part of the hole barrier layer 11 becomes the drift layer 10. After that, the resist film 51 is removed by asking or the like. The region of the hole barrier layer 11 may be enlarged by a subsequent thermal diffusion process.

The floating layer 18 may be formed above the upper surface of the semiconductor substrate 50 by the same method, although it is not shown. That is, a resist film is formed above the upper surface of the semiconductor substrate 50 by coating or the like. Then, the resist film is patterned by lithography. In the patterning, a pattern is formed in the resist film with an opened portion where the floating layer 18 is formed.

Then, using the patterned resist film as a mask, ion implantation or the like is performed to introduce the P type impurity such as boron into the side of the upper surface of the semiconductor substrate 50. Then, the floating layer 18 extending in the one direction is formed on the side of the upper surface of the semiconductor substrate 50, for example, between the adjacent hole barrier layers 11.

Next, as shown in FIG. 10, the trenches 20 are formed in the upper surface of the semiconductor substrate 50 including the first semiconductor layer by, for example, anisotropic dry etching using a patterned hard mask film (not shown) or the like. The trenches 20 are formed to extend in the Y axis direction. The trenches 20 penetrate the hole barrier layer 11 and reach the drift layer 10 in the Z axis direction. A plurality of the trenches 20 may be formed. When the plurality of trenches 20 are formed, they may be formed, for example, on both sides of the hole barrier layer 11 so as to sandwich the hole barrier layer 11. After that, the hard mask film and the like are removed by, for example, wet etching.

Next, as shown in FIG. 11, the hole barrier layer 11 is diffused. The diffusing is performed by, for example, heat treatment at a predetermined temperature and for a predetermined period of time. Then, a lower end of the hole barrier layer 11 is diffused to the vicinity of the lower end of the trenches 20. When the floating layer 18 is formed, the floating layer 18 is also diffused.

Next, an insulating film 52 having a predetermined thickness is formed on the upper surface of the semiconductor substrate 50 and the inner surfaces of the trenches 20, for example, by thermal oxidation. A portion of the insulating film 52 formed on the inner surfaces of the trenches 20 becomes the trench insulating films 21. In this way, the trench insulating films 21 are formed on the inner surfaces of the trenches 20.

Next, a conductive film 53 is deposited on the insulating films 52 of the semiconductor substrate 50 and on the insulating films 52 in the trenches 20, for example, by CVD to bury inside the trenches 20. The conductive film 53 is, for example, a doped poly-silicon film doped with phosphorus.

Next, as shown in FIG. 12, the conductive film 53 is etched back by, for example, dry etching. In this way, the trench electrodes 22 are formed inside the trenches 20 in which the gate insulating films 21 are formed.

Next, the insulating films 52 of the semiconductor substrate 50 outside the trenches 20 are removed by wet etching. Then, the trench insulating films 21 are left in the trenches 20. For the wet etching, for example, an etching solution containing hydrofluoric acid is used. Then, a resist film 54 is formed on the upper surface of the semiconductor substrate 50 and patterned.

Next, as shown in FIG. 13, ion implantation or the like is performed using the patterned resist film 54 as a mask. As a result, the P type impurity such as boron is introduced to form the body layer 12. After that, the resist film 54 is removed by asking or the like.

Next, as shown in FIG. 14, ion implantation or the like is performed to introduce the P type impurity such as boron using the patterned resist film 55 as a mask. Then, a deep layer 19 is partially formed between the hole barrier layer 11 and the body layer 12. For example, the impurity concentration of the deep layer 19 is made higher than the impurity concentration of the body layer 12. After that, the resist film 55 is removed by ashing or the like.

Next, as shown in FIG. 15, ion implantation or the like is performed to introduce the N type impurity such as arsenic using the patterned resist film 56 as a mask. Then, the emitter layer 13 is selectively formed on the body layer 12 above the deep layer 19. When the emitter layer 13 is formed, the length of the emitter layer 13 in the Y axis direction may be less than the length of the deep layer 19 in the Y axis direction.

In this way, the deep layer 19 partially provided above the first semiconductor layer, the body layer 12 provided on the first semiconductor layer and on the deep layer 19, and the emitter layer 13 provided on the body layer 12 on the deep layer 19 are formed in the semiconductor substrate 50. After that, the resist film 56 is removed by ashing or the like. When the emitter layer 13 is formed, ion implantation is performed using the same mask as that used to form the deep layer 19, so that the length of the emitter layer 13 in the Y axis direction will become substantially equal to the length of the deep layer 19 in the Y axis direction.

Next, as shown in FIG. 16, the interlayer insulating layer 31 is formed above the semiconductor substrate 50 by, for example, CVD. The interlayer insulating layer 31 includes a silicon oxide film such as PSG (Phosphosilicate Glass) film. Other than the PSG film, for example, a BPSG (Borophosphosilicate Glass) film, an NSG (Non-doped Silicate Glass) film, an SOG (Spin-On-Glass) film, or a composite film thereof may be used as the interlayer insulating layer 31.

Next, a patterned resist film (not shown) and the like are formed on the interlayer insulating layer 31. Then, using the patterned resist film or the like, the through groove 33 is formed in the interlayer insulating layer 31 by, for example, anisotropic dry etching. In this way, the through groove 33 penetrating the interlayer insulating layer 31 formed above the body layer 12 and on the emitter layer 13 is formed.

After that, the unnecessary resist film is removed by asking or the like. Next, the contact groove 30 communicating with the through groove 33 is formed in the body layer 12, for example, by anisotropic dry etching using the interlayer insulating layer 31. The contact groove 30 is formed to reach the body layer 12. In the portion where the emitter layer 13 is formed, the contact groove 30 is formed to penetrate the emitter layer 13.

For example, the contact layer 35 may be formed in the body layer 12 by performing ion implantation of the P type impurity via the contact groove 30.

Next, as shown in FIGS. 17 and 18, a metal layer made of, for example, aluminum is formed by sputtering or the like so as to be connected to the body layer 12 on the interlayer insulating layer 31, inside the through groove 33, and inside the contact groove 30. Then, the emitter wiring layer 32 is formed on the interlayer insulating layer 31. Further, the contact 34 is formed inside the through groove 33 and inside the contact groove 30.

Before the metal layer is formed, a TiW film may be formed as the barrier metal film on the interlayer insulating layer 31, on the inner surface of the through groove 33, and on the inner surface of the contact groove 30. In this way, the emitter wiring layer 32 to be connected to the body layer 12 via the through groove 33 is formed on the interlayer insulating layer 31. The emitter wiring layer 32 is connected to the body layer 12 via the contact groove 30 and the through groove 33.

Further, the field stop layer and the collector layer are formed under the drift layer 10. The collector wiring layer in contact with the collector layer is also formed. In this manner, the semiconductor device 1 is manufactured.

Next, effects of this embodiment will be described.

In the semiconductor device 1 of this embodiment, the lower portion of the emitter layer 13 is covered with the deep layer 19 containing the high concentration P type impurity. This reduces the base resistance rb of the parasitic NPN structure. Thus, the operation of the parasitic NPN structure can be prevented, thereby improving the latch-up tolerance and the short-circuit tolerance.

Moreover, in the semiconductor device 1, the impurity concentration profile of the deep layer 19 is not overlapped with that of the body layer 12. This reduces the influence of the high concentration impurity in the deep layer 19 on the body layer 12. Thus, the three-dimensional inversion layer can be formed, the influence of the deep layer 19 on the threshold voltage Vth can be reduced, and a path for a current to flow at the same threshold voltage Vth as that of the related art can be established.

The length of the emitter layer 13 in the Y axis direction is made less than the length of the deep layer 19 in the Y axis direction, and the length of the portion of the deep layer 19 in the Y direction where the emitter layer 13 is not formed on the deep layer 19 is made greater. Then, the latch-up tolerance can be improved. Further, the three-dimensional path for the channel electrons can be established.

When the length of the emitter layer 13 in the Y axis direction and the length of the deep layer 19 in the Y axis direction are made substantially equal, the manufacturing cost can be reduced while achieving a high latch-up tolerance.

The impurity concentration of the deep layer is made higher than the impurity concentration of the body layer 12. By doing so, the latch-up tolerance can be improved while maintaining the threshold voltage Vth.

The first semiconductor layer, the deep layer 19, the body layer 12, and the emitter layer 13 are formed between the adjacent trench electrodes 22, and the floating layer 18 is formed outside a portion between the adjacent trench electrodes 22. This improves the carrier accumulation effect and reduces the saturation voltage Vce (sat).

The emitter wiring layer 32 is connected to the body layer 12 via the contact 34 provided inside the through groove 33 penetrating the interlayer insulating layer 31 and inside the contact groove 30 formed in the body layer 12. This ensures the connection between the emitter wiring layer 32 and the body layer 12.

Second Embodiment

Figure 19:
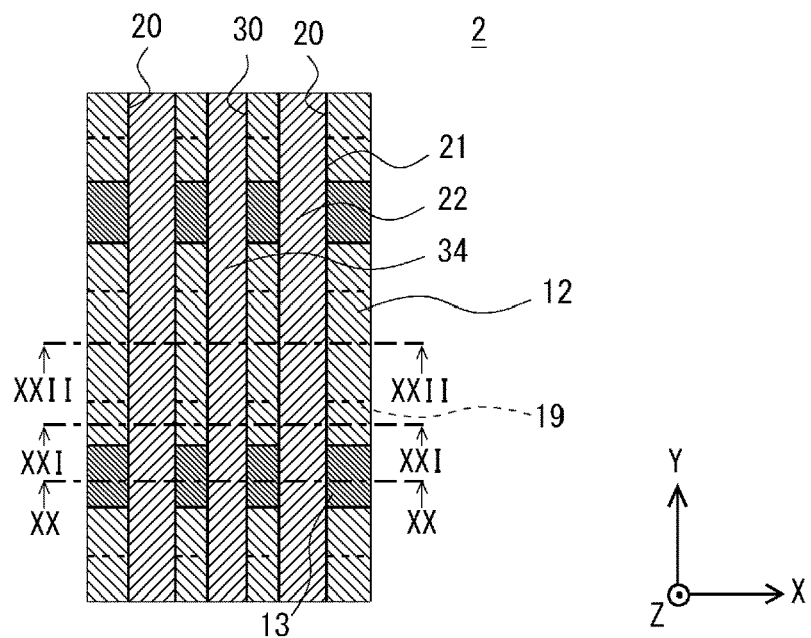
FIG. 19 is a top view showing an example of a semiconductor device according to a second embodiment.
Figure 20:
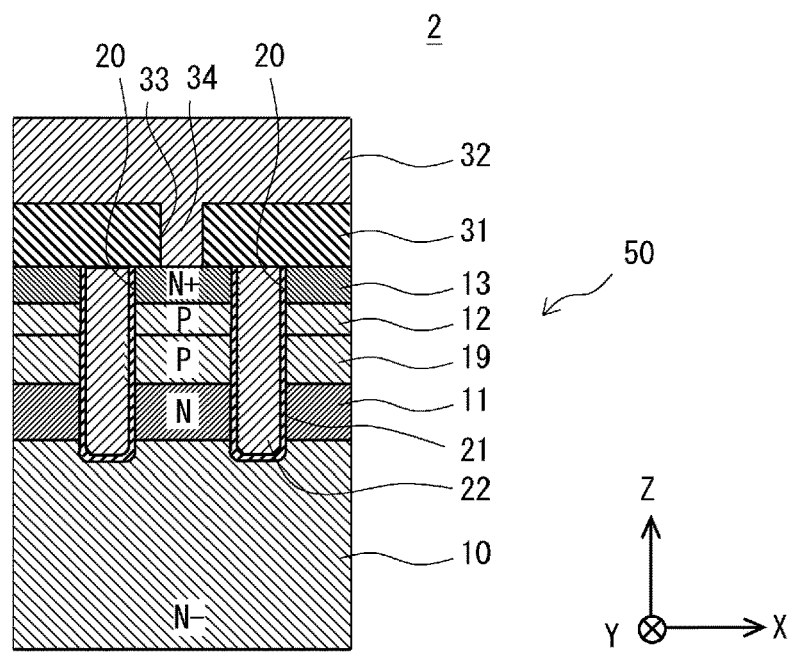
FIG. 20 is a cross-sectional view showing an example of the semiconductor device according to the second embodiment and showing a cross section taken along the line XX-XX of FIG. 19.
Figure 21:
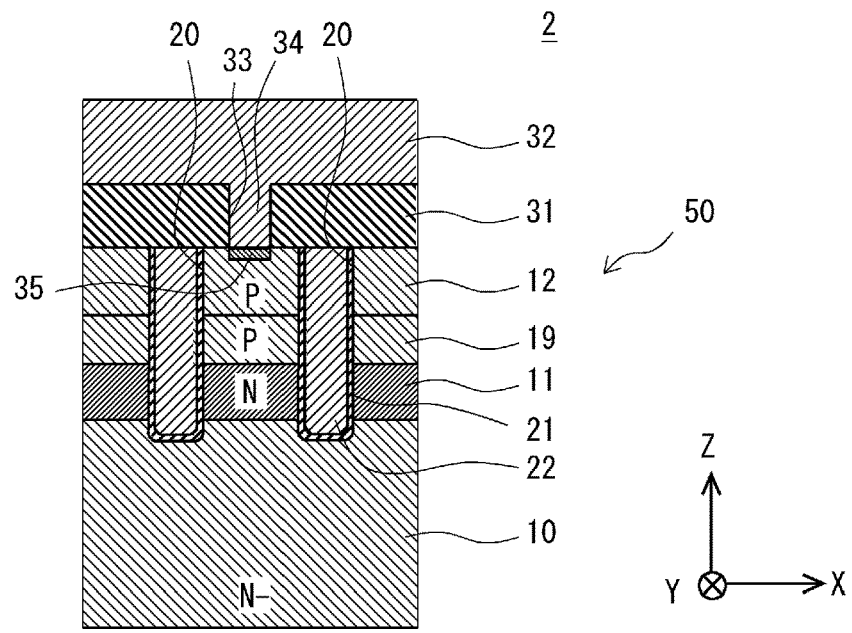
FIG. 21 is a cross-sectional view showing an example of the semiconductor device according to the second embodiment and showing a cross section taken along the line XXI-XXI of FIG. 19.
Figure 22:
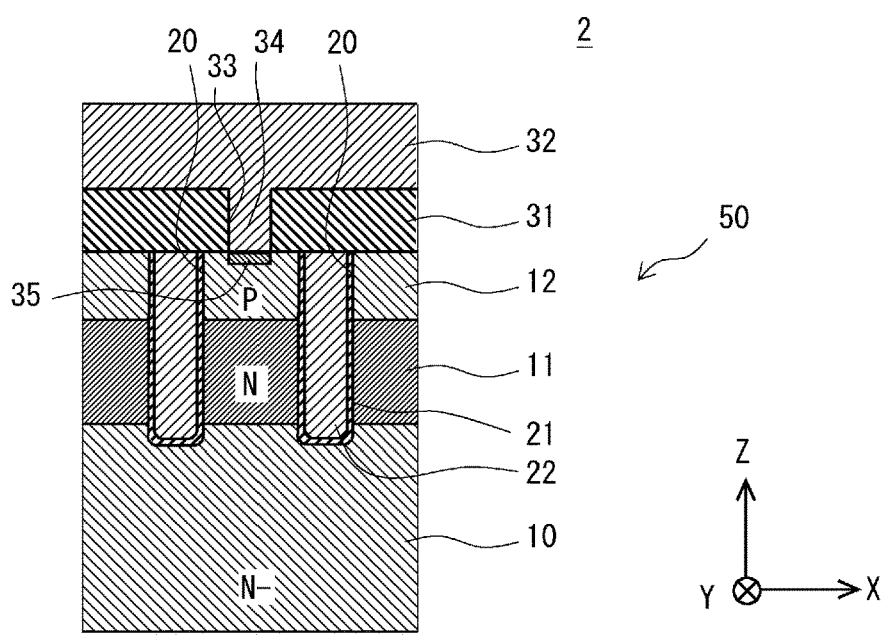
FIG. 22 is a cross-sectional view showing an example of the semiconductor device according to the second embodiment and showing a cross section taken along the line XXII-XXII of FIG. 19.

Next, a semiconductor device according to a second embodiment will be described. The semiconductor device of this embodiment does not include the contact groove 30. FIG. 19 is a top view showing an example of the semiconductor device according to the second embodiment. FIGS. 20 to 22 are cross-sectional views showing an example of the semiconductor device according to the second embodiment. FIG. 20 shows a cross section taken along the line XX-XX of FIG. 19. FIG. 21 shows a cross section along the line XXI-XXI of FIG. 19. FIG. 22 shows a cross section taken along the line XXII-XXII in FIG. 19. In FIG. 19, the interlayer insulating layer 31 and the emitter wiring layer 32 provided in the upper part of the semiconductor device are not shown.

As shown in FIGS. 19 to 22, the semiconductor device 2 does not include the contact groove 30. The contact 34 is provided only in the through groove 33. Therefore, the emitter wiring layer 32 is connected to the body layer 12 via the contact 34 provided inside the through groove 33 penetrating the interlayer insulating layer 31.

The contact layer 35 is provided on top of the body layer 12 that is in contact with the contact 34. The position of the lower end of the contact 34 and the positions of the openings of the trenches 20 in the semiconductor substrate 50 are substantially equal in the direction orthogonal to the upper surface of the semiconductor substrate 50, i.e., in the Z axis direction.

As described so far, in the semiconductor device 2, the process of forming the contact groove 30 in the semiconductor substrate 50 is omitted to thereby shorten the distance between the contact layer 35 and the trenches 20. This shortens the distance between the adjacent trenches 20, and thus the semiconductor device 2 can be miniaturized.

With the contact groove 30, it has been difficult to shorten the distance between the contact layer 35 and the trenches 20, because the threshold voltage Vth rises under the influence of the contact layer 35 formed at the bottom of the contact groove 30. It has been considered to omit the process of forming the contact groove 30 in the semiconductor substrate 50 in the related art. However, when the emitter layer 13 and the body layer 12 are alternately connected to the contact 34, the base resistance of the parasitic NPN structure rises, preventing the improvement in the latch-up tolerance.

In order to solve this problem, in this embodiment, the deep layer 19 is formed. This improves the latch-up tolerance even when the emitter layer 13 and the body layer 12 are alternately connected to the contact 34. The configuration and effects of the semiconductor device 2 other than those described above are the same as those of the first embodiment.

Third Embodiment

Figure 23:
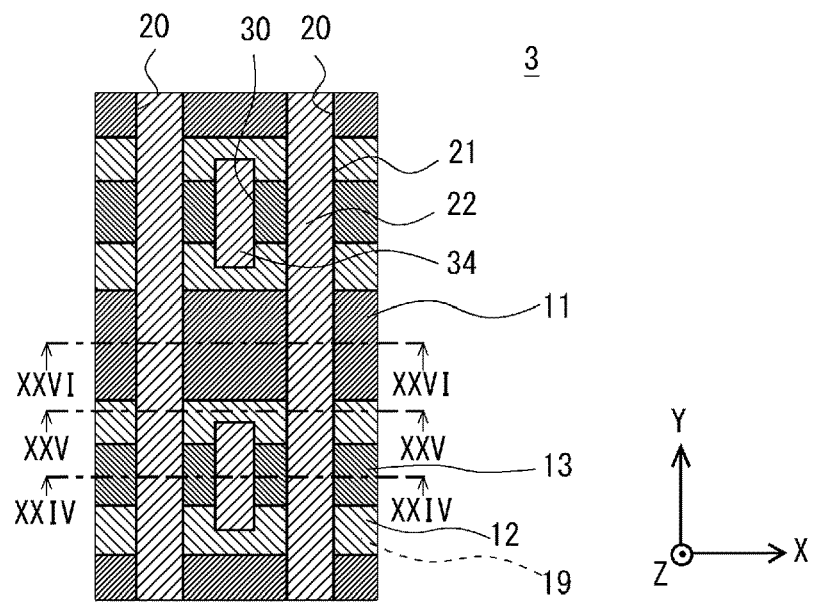
FIG. 23 is a top view showing an example of a semiconductor device according to a third embodiment.
Figure 24:
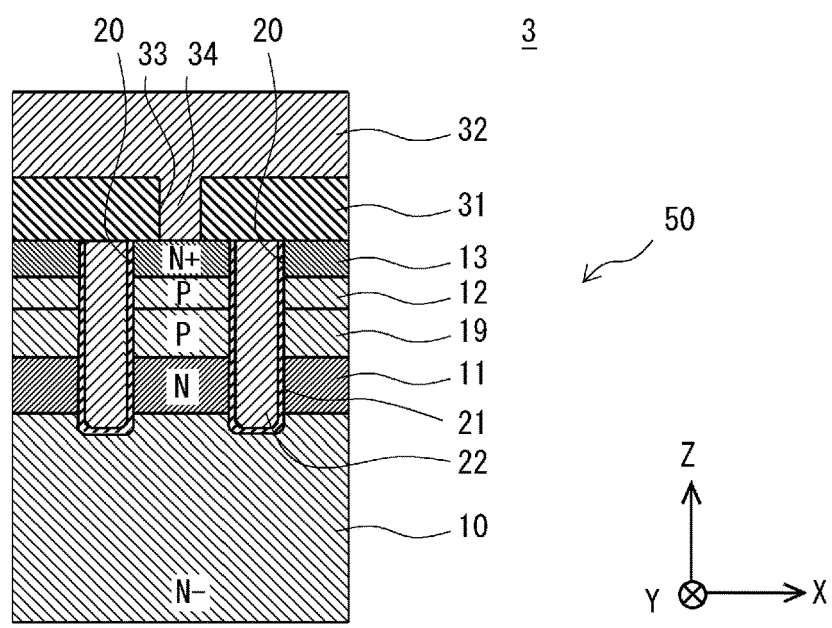
FIG. 24 is a cross-sectional view showing an example of the semiconductor device according to the third embodiment and showing a cross section taken along the line XXIV-XXIV of FIG. 23.
Figure 25:
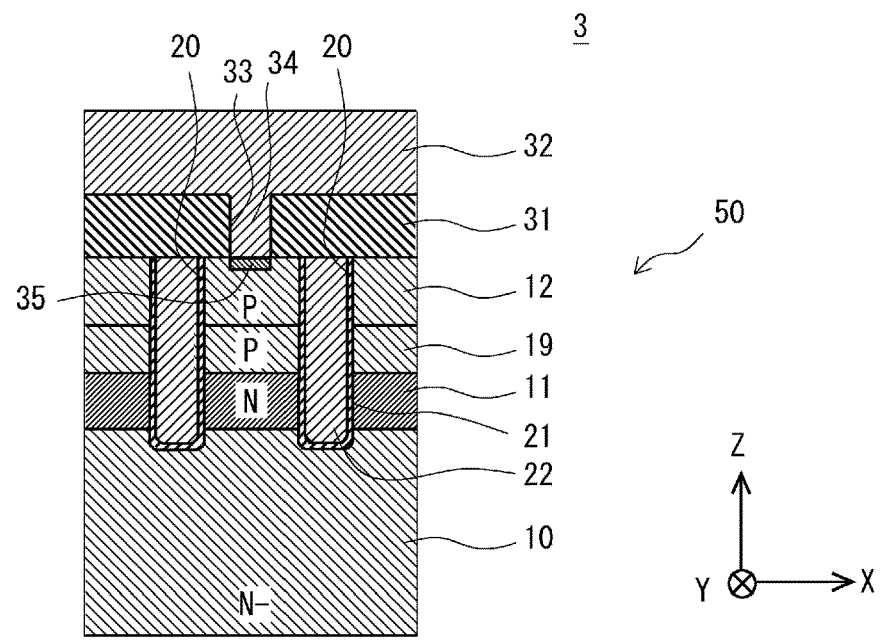
FIG. 25 is a cross-sectional view showing an example of the semiconductor device according to the third embodiment and showing a cross section taken along the line XXV-XXV of FIG. 23.
Figure 26:
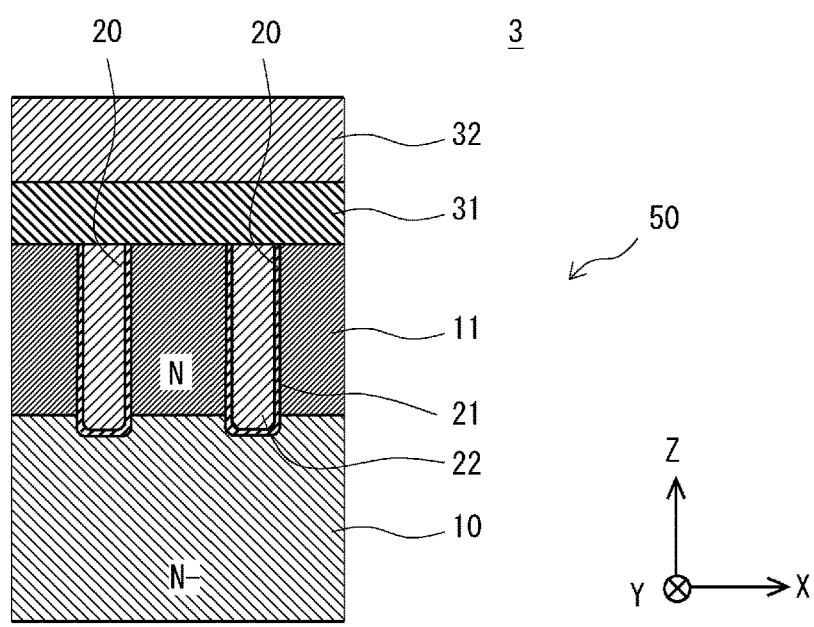
FIG. 26 is a cross-sectional view showing an example of the semiconductor device according to the third embodiment and showing a cross section taken along the line XXVI-XXVI of FIG. 23.
Figure 27:
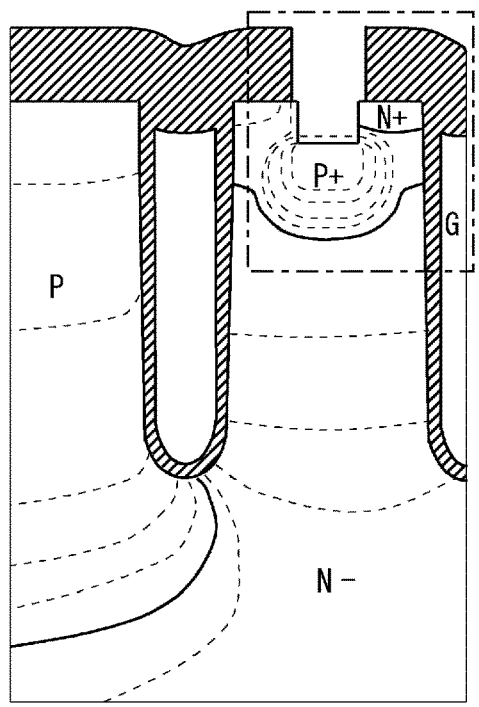
FIG. 27 is a cross-sectional view showing an example of a semiconductor layer of an IGBT.
Figure 28:
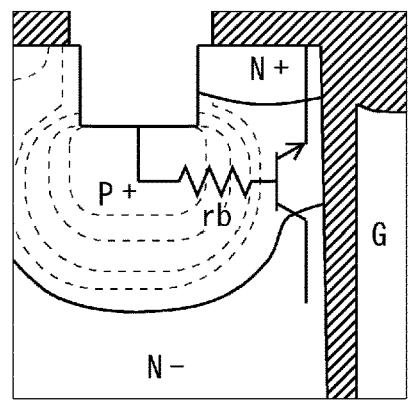
FIG. 28 is a cross-sectional view showing an example of the semiconductor layer of the IGBT and is an enlarged view of FIG. 27.

Next, a semiconductor device according to a third embodiment will be described. In this embodiment, the body layer 12 is also partially provided on the hole barrier layer 11 in the one direction. FIG. 23 is a top view showing an example of the semiconductor device according to the third embodiment. FIGS. 24 to 26 are cross-sectional views showing an example of the semiconductor device according to the third embodiment. FIG. 24 shows a cross section taken along the line XXIV-XXIV of FIG. 23. FIG. 25 shows a cross section taken along the line XXV-XXV of FIG. 23. FIG. 26 shows a cross section taken along the line XXVI-XXVI of FIG. 23. In FIG. 23, the insulating layer and the wiring layer provided in the upper part of the semiconductor device are not shown.

As shown in FIG. 24, in the semiconductor device 3, in the semiconductor substrate 50 near the trench insulating film 21 in the cross section taken along the line XXIV-XXIV, the drift layer 10, the hole barrier layer 11, the deep layer 19, the body layer 12, and the emitter layer 13 are stacked in order from the bottom.

As shown in FIG. 25, in the semiconductor substrate 50 near the trench insulating film 21 in the cross section taken along the line XXV-XXV, the drift layer 10, the hole barrier layer 11, the deep layer 19, and the body layer 12 are stacked in order from the bottom. The configuration of the semiconductor substrate 50 in FIGS. 24 and 25 is the same as that of the second embodiment.

However, as shown in FIG. 26, in the semiconductor substrate 50 near the gate insulating film 21 in the cross section taken along the line XXVI-XXVI, the drift layer 10 and the hole barrier layer 11 are stacked in order from the bottom.

As described above, in the semiconductor device 3, the body layer 12 is also partially provided on the hole barrier layer 11 in the one direction. Thus, the semiconductor device 3 has a portion where the deep layer 19, the body layer 12 and the emitter layer 13 are not provided above the first semiconductor layer.

Further, for example, the length of the deep layer 19 in the Y axis direction may be substantially equal to the length of the body layer 12 in the Y axis direction. A plurality of the deep layers 19, a plurality of the body layers 12, and a plurality of the emitter layers 13 may be provided spaced apart from one another in the Y axis direction. In such a case, the body layer 12 and the emitter layer 13 may not be provided above the first semiconductor layer between the adjacent deep layers 19. The electrons passing through the channel move in the Y axis direction along the inversion layer formed to extend in the Y axis direction right above the deep layer 19. Then, the electrons moved in the Y axis direction reach the hole barrier layer 11 adjacent to the body layer 12. Thus, the electrons reaching the hole barrier layer 11 reach the drift layer 10.

As described above, as the body layer 12 is provided only right under the emitter layer 13, a small amount of the hole current is drawn, and thus the carrier accumulation effect can be enhanced. That is, the saturation voltage Vce (sat) can be reduced.

The interlayer insulating layer 31 is provided in the semiconductor substrate 50. That is, the interlayer insulating layer 31 is provided above the hole barrier layer 11, on the body layer 12, and on the emitter layer 13 in the semiconductor substrate 50, and the emitter wiring layer 32 is provided on the interlayer insulating layer 31. The emitter wiring layer 32 is connected to the body layer 12 via a plurality of contacts 34 provided in a plurality of through grooves 33 penetrating portions of the interlayer insulating layer 31 on the body layer 12. The position of the lower end of the contact 34 and the position of the openings of the trenches 20 in the semiconductor substrate 50 are substantially equal in the Z axis direction orthogonal to the upper surface of the semiconductor substrate 50.

Omitting the process of forming the contact groove 30 in this way reduces the manufacturing cost. This shortens the distance between the contact layer 35 and the trenches 20. This also shortens the distance between the adjacent trenches 20, and thus the semiconductor device 3 can be miniaturized. Other configurations and effects are the same as those of the first and second embodiments.

Although the present disclosure made by the present inventor has been described in detail based on the embodiments, it is obvious that the present disclosure is not limited to the above embodiments, and various modifications can be made without departing from the scope of the disclosure.

The first, second and third embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A semiconductor device comprising:
   a semiconductor substrate comprising an upper surface;
   a trench electrode provided inside a trench formed on the upper surface; and
   a trench insulating film provided between the trench electrode and the semiconductor substrate, wherein
   the semiconductor substrate comprises:
      a first semiconductor layer of a first conductivity type, a lower end of the trench electrode reaching the first semiconductor layer;
      a deep layer of a second conductivity type provided on a portion of the first semiconductor layer, and in contact with the trench insulating film;
      a second semiconductor layer of the second conductivity type provided on the first semiconductor layer and on the deep layer, and in contact with the trench insulating film; and
      a third semiconductor layer of the first conductivity type provided on the second semiconductor layer above the deep layer,
   wherein
   the trench electrode extends along a first direction in a plane parallel to the upper surface of the semiconductor substrate,
   a plurality of deep layers, a plurality of second semiconductor layers, and a plurality of third semiconductor layers are provided, the deep layers being spaced apart from each other along the first direction, the second semiconductor layers being spaced apart from each other along the first direction, and the third semiconductor layers being spaced apart from each other along the first direction,
   the semiconductor device further comprises:
      an interlayer insulating layer provided on the semiconductor substrate; and a wiring layer provided on the interlayer insulating layer, the wiring layer is connected to the second semiconductor layers via a plurality of contacts provided inside a plurality of though grooves penetrating the interlayer insulating layer above the second semiconductor layers, and a position of a lower end of a contact and a position of an opening of the trench are substantially equal in a direction orthogonal to the upper surface of the semiconductor substrate.

2. The semiconductor device according to claim 1, wherein a length of the third semiconductor layer in the first direction is less than a length of the deep layer in the first direction.

3. The semiconductor device according to claim 2, wherein the plurality of deep layers are provided on the first semiconductor layer; and the plurality of third semiconductor layers are provided on the second semiconductor layer, the third semiconductor layers being provided above corresponding deep layers along the first direction, and in the first direction, there are no third semiconductor layers provided above the first semiconductor layer between adjacent deep layers.

4. The semiconductor device according to claim 1, wherein a length of the third semiconductor layer in the first direction is substantially equal to a length of the deep layer in the first direction.

5. The semiconductor device according to claim 1, wherein an impurity concentration of the deep layer is higher than an impurity concentration of the second semiconductor layer.

6. The semiconductor device according to claim 1, wherein the third semiconductor layer overlaps only a portion of the deep layer.

7. The semiconductor layer according to claim 1, wherein the deep layer and the third semiconductor layer overlap only a portion of the first semiconductor layer.

8. The semiconductor device according to claim 1, wherein a plurality of trench electrodes are provided, a portion between adjacent trench electrodes comprises the first semiconductor layer, the deep layer, the second semiconductor layer, and the third semiconductor layer, and a floating layer of the second conductivity type is provided on a portion other than the portion between adjacent trench electrodes.

9. The semiconductor device according to claim 1, wherein a plurality of trench electrodes are provided, the plurality of trench electrodes includes a first and a second trench electrode, the first semiconductor layer, the deep layer, the second semiconductor layer, and the third semiconductor layer are in contact with the trench insulating film provided around the first trench electrode, and the semiconductor device further comprises a floating layer of the second conductivity type provided around the second trench electrode in contact with the trench insulating film.

10. The semiconductor device according to claim 1, wherein the wiring layer is connected to the second semiconductor layer via a contact provided inside a contact groove formed in the second semiconductor layer.

11. The semiconductor device according to claim 1, wherein a length of the deep layer in the first direction is substantially equal to a length of the second semiconductor layer in the first direction.

12. The semiconductor device according to claim 1, wherein a portion of the first semiconductor layer is not overlapped with the deep layer, the second semiconductor layer, and the third semiconductor layer.

13. The semiconductor device according to claim 1, wherein the plurality of deep layers are provided on the first semiconductor layer, the plurality of second semiconductor layers are provided on the first semiconductor layer and the plurality of deep layers, the plurality of third semiconductor layers are provided on the plurality of second semiconductor layers and the plurality of deep layers, and in the first direction, no second semiconductor layer and no third semiconductor layer is provided above the first semiconductor layer between adjacent deep layers.

* * * * *